United States Patent [19]
Yanagiuchi

[11] Patent Number: 5,684,418
[45] Date of Patent: Nov. 4, 1997

[54] CLOCK SIGNAL GENERATOR

[75] Inventor: Hiroshi Yanagiuchi, Kanagawa, Japan

[73] Assignee: Sony Corporation, Japan

[21] Appl. No.: 577,812

[22] Filed: Dec. 22, 1995

[30]  Foreign Application Priority Data

Dec. 26, 1994  [JP]  Japan .................................. 6-323293

[51] Int. Cl.$^6$ .................................................. H03B 19/00
[52] U.S. Cl. .......................... 327/99; 327/298; 327/115; 327/116; 327/117; 377/47
[58] Field of Search .............................. 327/99, 115, 116, 327/117, 119, 120, 121, 295, 298, 105, 113; 377/47, 48

[56]  References Cited

U.S. PATENT DOCUMENTS

| | | | |
|---|---|---|---|
| 4,283,768 | 8/1981 | Scott | 327/121 |
| 4,615,005 | 9/1986 | Maejima et al. | 364/200 |
| 4,893,271 | 1/1990 | Davis et al. | 364/900 |
| 5,019,785 | 5/1991 | Fognini et al. | 327/105 |
| 5,136,180 | 8/1992 | Caviasca et al. | 327/115 |
| 5,142,247 | 8/1992 | Lada, Jr. et al. | 331/14 |
| 5,389,826 | 2/1995 | Sonobe | 327/115 |

OTHER PUBLICATIONS

"Generation of Square waves from programmable frequency divider" by Atis D. Mitra, Electronics, vol. 49, No.4, pp. 343-344, Oct. 1980.

Primary Examiner—Timothy P. Callahan
Assistant Examiner—T. T. Lam
Attorney, Agent, or Firm—Ronald P. Kananen

[57]  ABSTRACT

A clock signal generator can prevent unnecessary power consumption and can lower the power consumption of a system or a chip as a whole. A clock generator has a plurality of multipliers having variable multiplying factors and multiplying a single input reference clock signal by a designated multiplying factor. A plurality of frequency dividers have variable divide factors and divide a clock signal by a designated dividing factor. A clock selector selects a clock signal which has a required frequency according to a status signal STS from each of the functional locks from among the clock signals having a plurality of frequencies generated by the clock generator. The clock selectors stops the operation of the multipliers or the frequency dividers which are generating unused frequencies by switching clock signals.

15 Claims, 10 Drawing Sheets ctu0 ctun

CLOCK SIGNAL GENERATOR

BACKGROUND OF THE INVENTION

1. Field of the invention

The present invention relates to a clock signal generator for generating a plurality of clock signals, which have required frequencies, based on a reference clock signal.

2. Description of the Related Art

In recent years, large-scale integrated circuits (LSI) have been designed to achieve reduced chip areas and realize further added value by fitting on single chips systems which used to be configured by a plurality of chips having the same or different functions.

In this case, despite the advances made in semiconductor processing techniques, due to the differences in operations, it is difficult to make such a new single chip LSI operate by the same system clock signal.

Also, in the functional blocks of a chip, low power consumption is achieved by switching the clock signals at times of inactivity. However, this is not appropriate when there are only a few types of low frequency clock signals supplied. It is necessary to supply the clock signals in accordance with the operations of the system or blocks in the chip.

Conventional apparatuses which generate a plurality of clock signals and supply them to a system, however, either require a plurality of input clock signals, are extremely limited in the types of the clock signals which they can supply, can only allocate signals to a small number of blocks in a chip, and therefore can only reduce the power consumption in a rough manner. With this extent of reduction of power consumption, there are inherent limits to the degree to which the power consumption can be reduced in the system or chip.

SUMMARY OF THE INVENTION

An object of the present invention is to provide a clock signal generator which can supply a plurality of clock signals having required frequencies and can prevent needless power consumption for each clock by switching the frequency supplied to each block in a system according to the status of operation of the block.

Another object of the present invention is to provide a clock signal generator which can make a multiplier and a frequency divider generating a frequency which is not being used stop and thereby prevent needless power consumption and achieve a low power consumption of a system or chip as a whole.

According to the present invention, there is provided a clock signal generator which can generate and supply a clock signal having any frequency for at least one functional block which comprises a system, comprising:

a clock generator having at least one multiplier which has a variable multiplying factor and multiplies a single input reference clock signal by a designated multiplying factor and at least one frequency divider which has a variable dividing factor and divides an input clock signal by a designated dividing factor and a clock selector for selecting a clock signal which has a required frequency according to operational information of functional blocks from among the clock signals having a plurality of frequencies generated by the clock generator and supplied to the functional blocks.

Preferably, the multiplier is provided with a first pulse signal generator generating a first pulse signal which has a predetermined pulse width according to the reference clock signal, a decision circuit deciding a delay value according to a natural number which designates a multiplying factor from the outside, a delay circuit delaying an input pulse signal according to the delay value, an output circuit switching an output level between a first level and a second level at each input of the first pulse signal or a second pulse signal, a second pulse signal generator receiving a delay pulse signal output from the delay circuit and generating the second pulse signal and a third pulse signal which have a complementary relationship with each other using a natural number designating a multiplying factor from the outside and inputting the second pulse signal to the delay circuit and the output circuit, and a pulse adjusting circuit comparing a first pulse signal generated by the first pulse signal generator with the third pulse signal and feeding back a result of the comparison to the delay circuit to adjust a phase of the signal.

Preferably, the frequency divider is provided with a pulse signal generator generating a pulse signal which has a predetermined pulse width based on a reference clock signal, a delay circuit receiving a pulse signal generated by the pulse signal generator and delaying the pulse signal by a natural number designating a dividing factor from the outside, and an output circuit outputting a clock signal which has a pulse width proportional to a delay value of the delay circuit.

Preferably, the clock signal generator has a circuit which makes a multiplier or a frequency divider generating a not used frequency stop by switching the clock signals.

Preferably, the clock selector is provided with a plurality of latch groups each latching a plurality of status signals output from a plurality of functional blocks, a plurality of selectors each selecting a clock signal which has a required frequency from among a plurality of clock signals of any frequency generated by the multipliers and the frequency dividers of the clock generator, and a clock generating and selecting circuit adjusting the selection timings of the clock signals of each of the selectors according to the input and output information of status signals in the latch groups and generating an operation control signal which holds, among the multipliers and the frequency dividers, only the multipliers and the frequency dividers generating clock signals of the frequencies required for use in the operational states and holds the multipliers and the frequency dividers generating clock signals of frequencies not in use in non-operational states.

Preferably, the clock signal generator has an inhibit circuit which inhibits the stopping of the output of clock signals from the selectors when there is a clock signal of a frequency which will be used by another functional block in spite of not used by a predetermined functional block.

BRIEF DESCRIPTION OF THE DRAWINGS

These and other objects and features of the present invention will become more apparent from the following description of the preferred embodiments made with reference to the drawings, in which.

DESCRIPTION OF THE PREFERRED EMBODIMENTS

According to the clock signal generator of the present invention, a reference clock signal from the outside is input to the multipliers and the frequency dividers of the clock generator. In the multipliers, the multiplying factors are respectively set by natural numbers designated by outside hardware or software. Clock signals having any multiple of the reference frequency are generated according to the set multiplying factors.

Similarly, in the frequency dividers, the dividing factors are respective set by natural numbers designated by outside hardware or software. Clock signals having any fraction of an input clock signal are generated according to the set dividing factors.

These clock signals having these plurality of frequencies generated by the multipliers and the frequency dividers are output to the clock selector.

In the clock selector, the clock signal which has the required frequency is selected according to a status signal indicating operational information of each of the functional blocks from among the clock signals having the plurality of frequencies generated by the clock generator and supplied to the functional blocks.

The multipliers and the frequency dividers generating unused frequencies receive for example an operation control signal and are stopped from operation by switching of the clock signals.

Preferred embodiments of the present invention will now be explained in detail with reference to the drawings.

Figure 1:
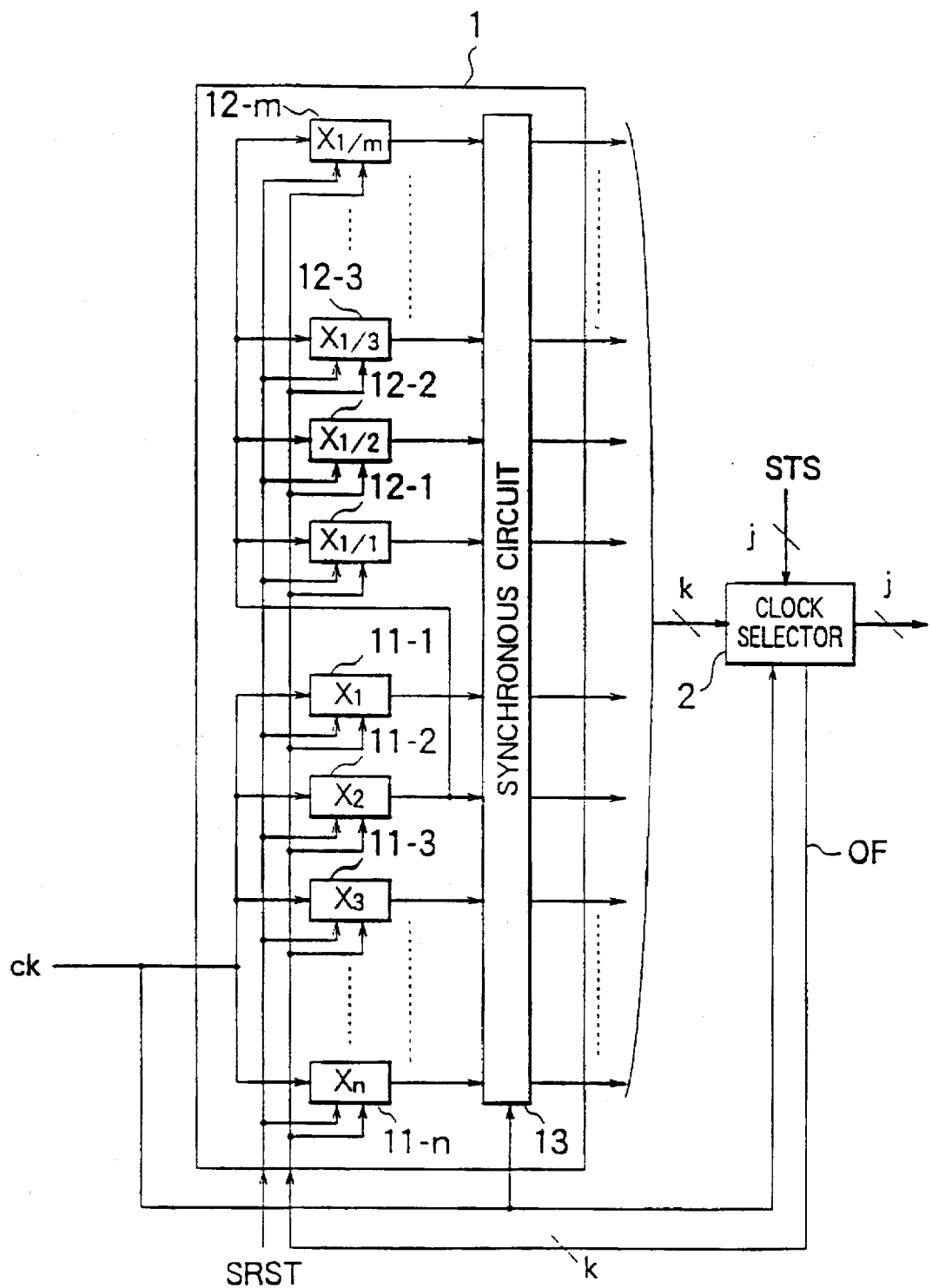
FIG. 1 is a view of the system configuration of an embodiment of a clock signal generator according to the present invention.

FIG. 1 is a view of the system configuration of an embodiment of a clock signal generator according to the present invention.

As shown in FIG. 1, the clock signal generator is configured as a clock generator 1 and a clock selector 2.

The clock generator I is configured as n number of multipliers 11-1 to 11-n having variable multiplying factors and multiplying a single input external reference clock signal (referred to as an external clock signal below) by means of the multiplying factors (x1) to (xn) respectively. The clock generator 1 also has number of frequency dividers 12-1 to 12-m having variable dividing factors and dividing a clock signal, which is generated by the multiplier 11-2 multiplying by the multiplying factor (x2) and synchronized with the external clock signal CK, by means of the dividing factors (x1/1) to (x1/m). The clock generator 1 further has a synchronous circuit 13 making k(n+m) number of clock signals, which are generated by the multipliers 11-1 to 11-n and the frequency dividers 12-1 to 12-m and have different frequencies, synchronize with the external clock signal CK and outputting the same.

The multipliers 11-1 to 11-n and the frequency dividers 12-1 to 12-m are reset by a system reset signal SRST and controlled operation status and stop status by an operation control signal OF which is output from the clock selector 2.

Note that, needless to say the frequency dividers 12-1 to 12-m can be constituted to directly divide the single input external signal CK the same as the multipliers.

The clock selector 2 receives a plurality of clock signals generated by the clock generator 1 and supplies different signals by switching the frequency according to the operational status of each of the functional blocks of a system not shown in the drawings based on the status signals STS sent from each of the functional blocks. Also, the clock selector 2 generates the operation control signal OF for stopping the multipliers 11-1 to 11-n and the frequency dividers 12-1 to 12-m in the clock generator when they generate an unused frequency and outputs the signal OF to the clock generator 1.

An explanation will be made below of concrete examples of the constructions and operations of a multiplier 11 and a frequency divider 12 in the clock generator 1 and the clock selector 2 with reference to FIG. 2 to FIG. 11.

Figure 2:
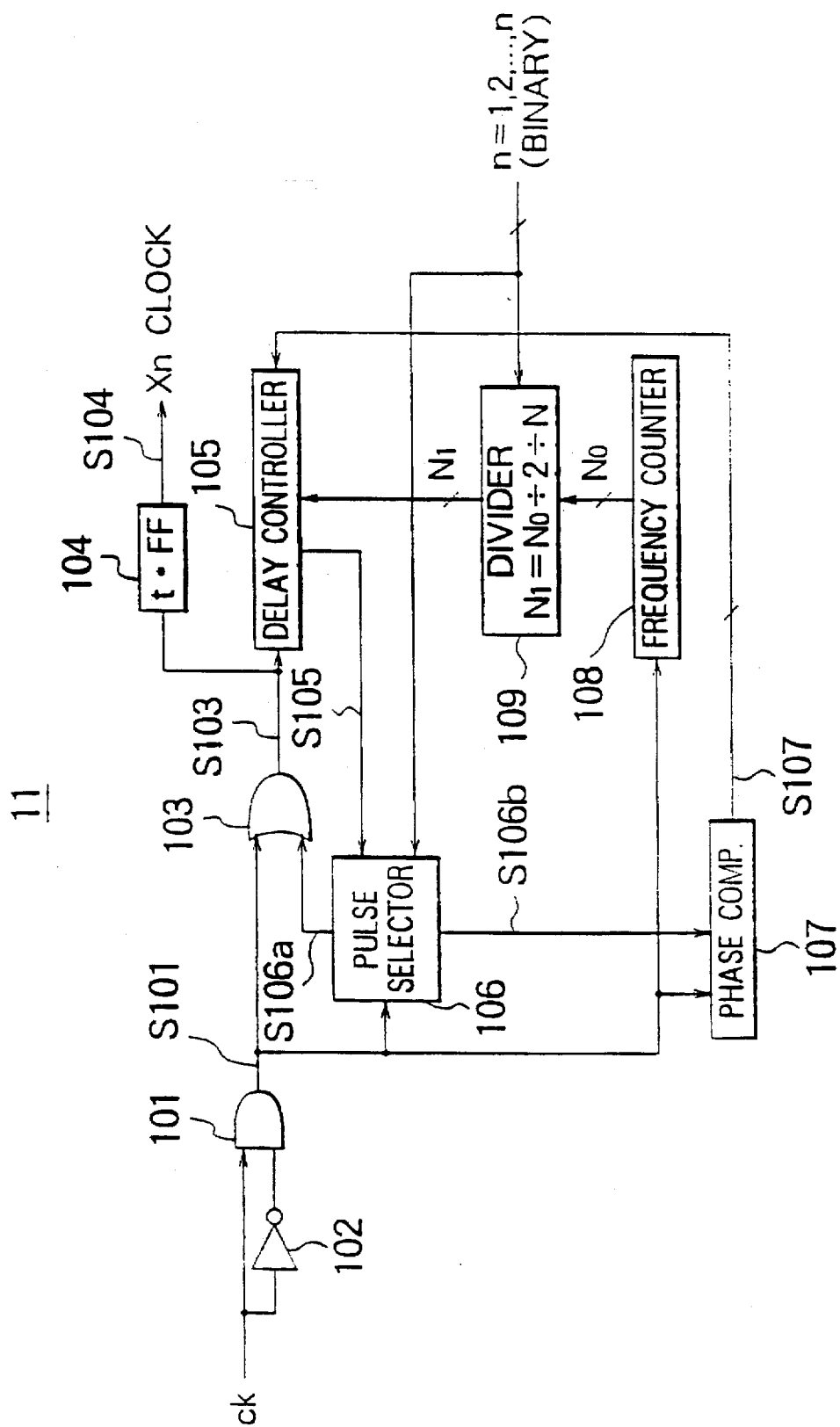
FIG. 2 is a block diagram of an example of the construction of a multiplier according to the present invention.
Figure 3:
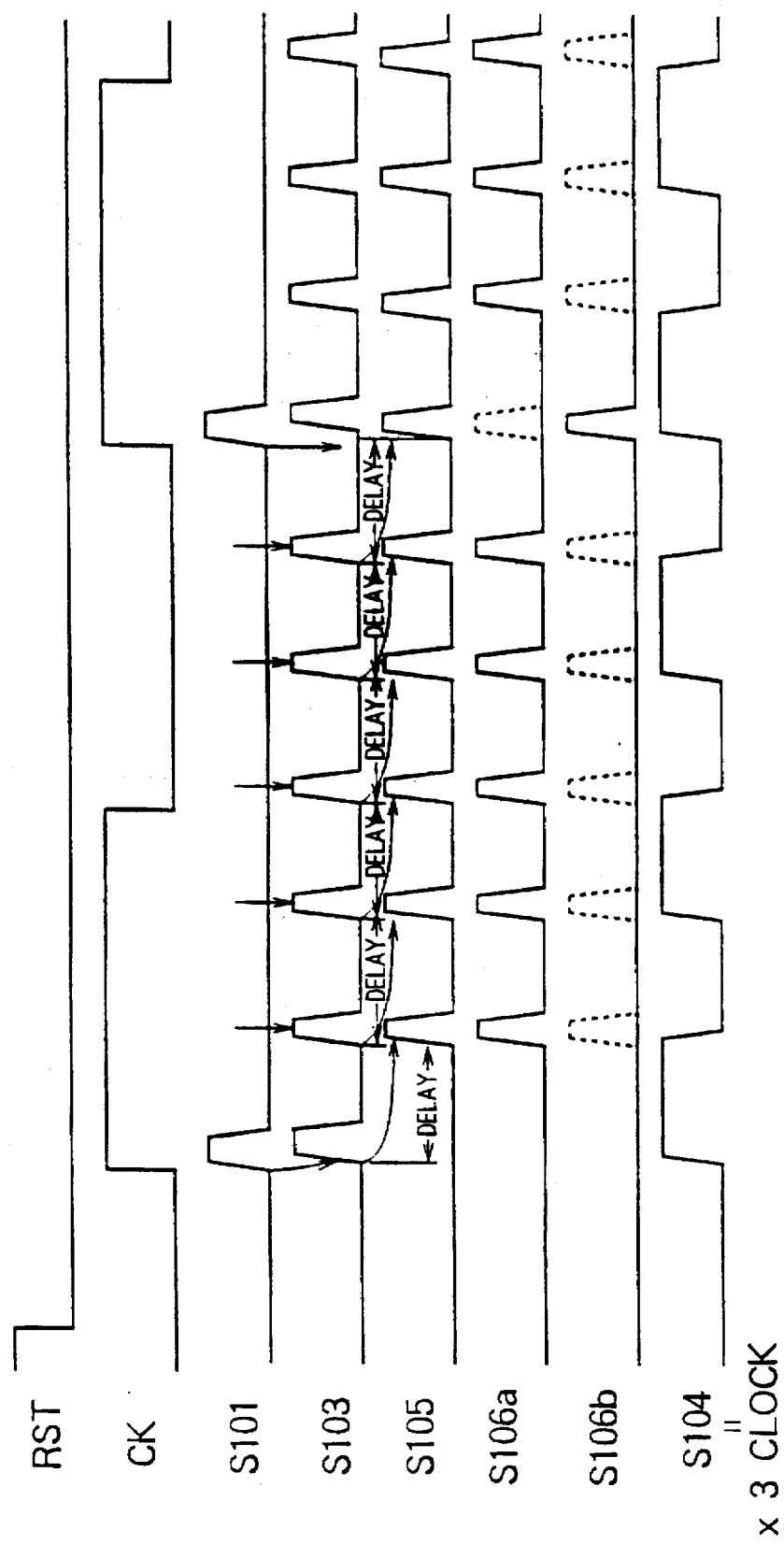
FIG. 3 is a timing chart of input and output waveforms in the case of constructing a multiplier in which the multiplying factor is three in FIG. 2.

FIG. 2 is a block diagram of an example of the construction of the multiplier 11, and FIG. 3 is a timing chart of the input and output waveforms in the case of constructing a multiplier with a multiplying factor of three.

As shown in FIG. 2, the multiplier 11 is configured as a two-input AND gate 101 and inverter 102 constructing a differentiating circuit which differentiates the external clock signal CK. The multiplier 11 also has a two-input OR gate 103 in which one input terminal receives as input an output differentiated signal S101 (first pulse signal) of the two-input AND gate 101, a T-type flip-flop S104 receiving an output pulse signal S103 of the two-input OR gate 103 and outputting a clock signal 104 which consists of the input external clock signal CK multiplied by n. A delay controller 105 receives the output pulse signal S103 of the two-input OR gate 103, delays the pulse signal S103 according to a delay time based on a phase comparative signal S107 and a delay value N1, and outputs the result as a signal S105. A pulse selector 106 receives the differentiated signal S101, the delay pulse signal S105 output from the delay controller 105, and a binary number n (=1, 2, ..., n) indicated from outside by hardware or software. The plus selector 106 outputs sequential (2×n−1) numbers of second pulse signals S106a synchronized with the delay pulse signal S105 to the other terminal of the two-input OR gate 103 and outputs a third pulse signal S106b comprised of one pulse at the time it runs up to (2×n). A phase comparator 107 compares a phase of the differentiated signals S101 with a phase of the output signal S106b of the pulse selector 106 and outputs a phase comparison signal S107 as a result of the comparison to the delay controller 105. A frequency counter 108 counts a frequency based on the differentiated signal S101 and outputs a count value NO. A divider 109 receives the count value NO of the frequency counter 108 and a binary number n (=1, 2, ..., n) indicated from outside and obtains a delay value N1 based on the expression (N0/2/n).

Figure 4:
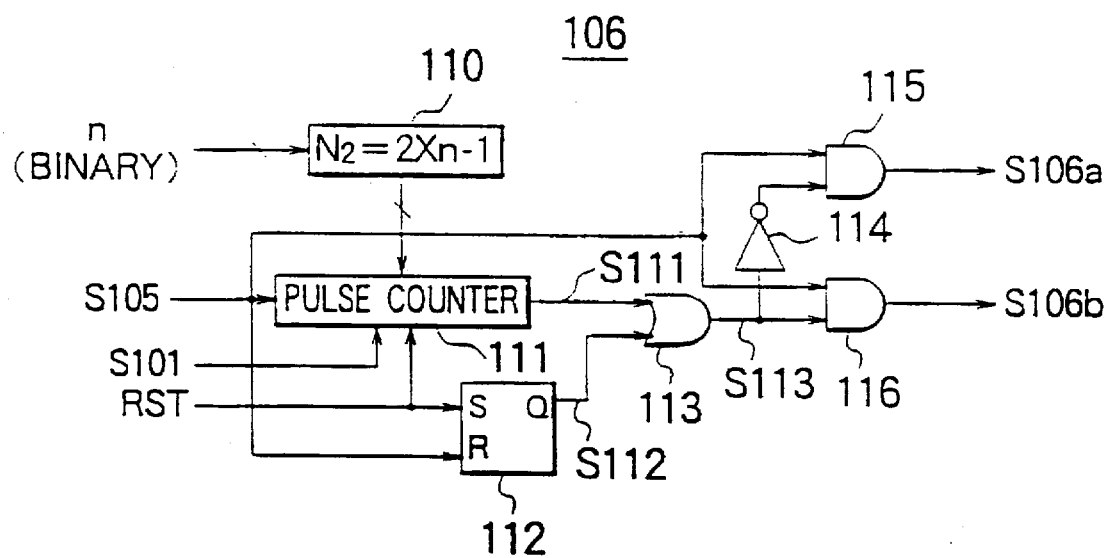
FIG. 4 is a circuit diagram of an example of the construction of a pulse selector 106 in FIG. 2.

FIG. 4 is a circuit diagram of an example of the concrete construction of the pulse selector 106 in FIG. 2.

As shown in FIG. 4, the pulse selector 106 is configured as an arithmetic unit 110 receiving the binary number n indicated from outside and obtaining a parameter N2 based on an expression (2×n1). A pulse counter 111 counts pulse numbers of the delay pulse signal S105 according to an output of the arithmetic unit 110 and the differentiated signal S101. A flip-flop 112 receives input a reset signal RST at a set terminal S and receives the delay pulse signal S105 at a reset input terminal R. A two-input OR gate 113 takes a logical sum (OR) between an output signal S111 of the pulse counter 111 and an output signal S112 from an output terminal Q of the flip-flop 112. An inverter 114 inverts a level of an output signal S113 of the OR gate 113. A two-input AND gate 115 takes a logical product between the delay pulse signal S105 and an output of the inverter 114 and outputting the result of the logical product to the two-input OR gate 103 in FIG. 2 as a second pulse signal S106a. A two-input AND gate 116 take a logical product between the delay pulse signal S105 and the output signal S113 of the OR gate 113 and outputs the result of the logical product to the phase comparator 107 in FIG. 2 as a third pulse signal S106b.

Figure 5:
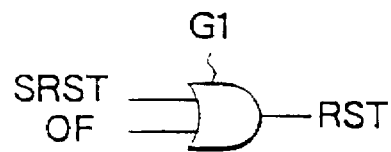
FIG. 5 is a view of an example of a reset signal generating circuit according to the present invention.

Note that, the pulse selector 111 is reset by an active reset signal RST at a high level. As shown in FIG. 5, the reset signal RST is generated by taking the logical sum between the system reset signal SRST and the operation control signal OF from the clock selector 2 at a two-input OR gate GL Further, FIG. 6 is a circuit diagram of an example of a concrete construction of the pulse counter 111 in FIG. 5, and FIG. 7 is a timing chart of the input and output waveforms of principal parts in FIG. 4 and FIG. 6.

Figure 6:
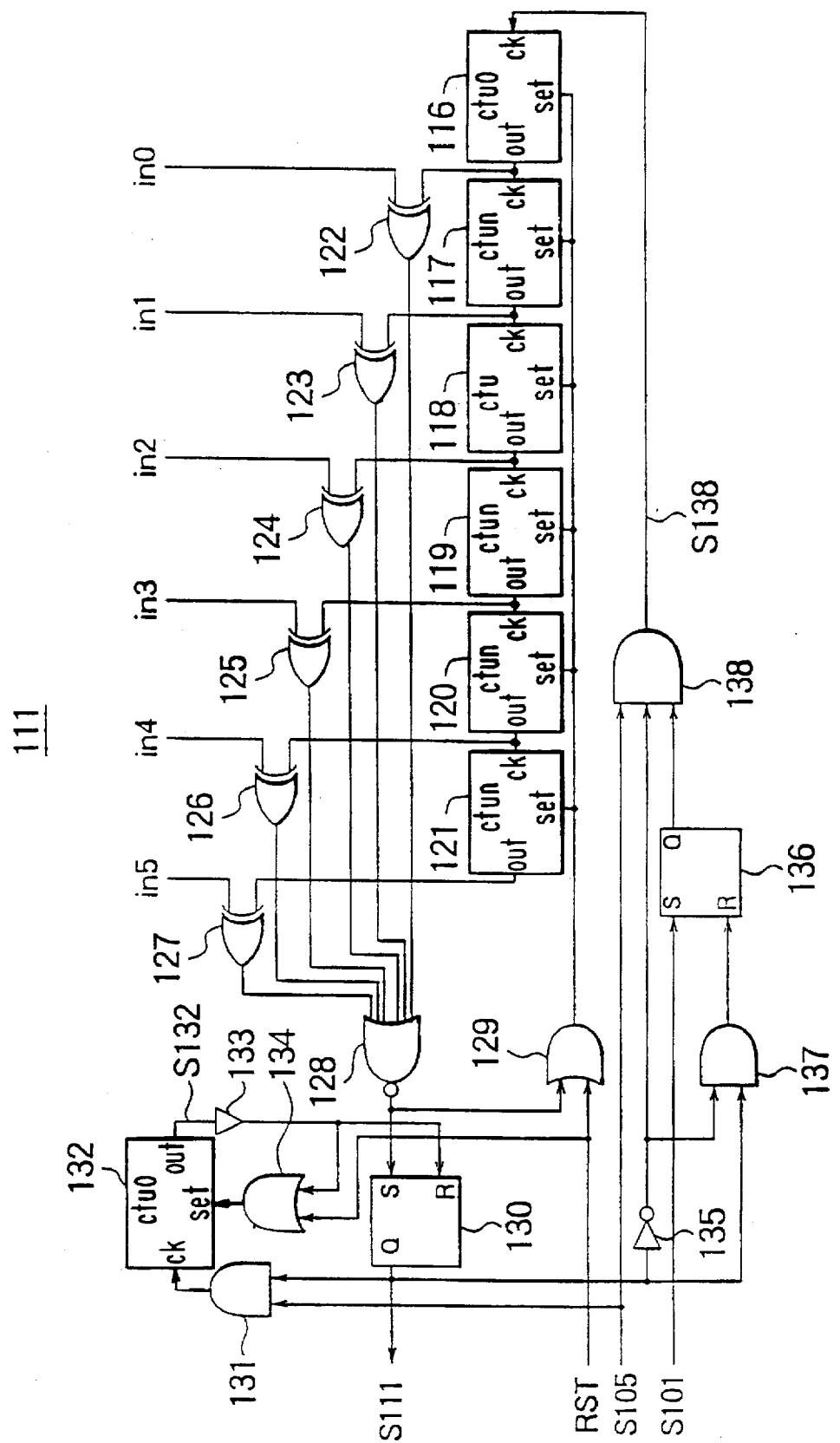
FIG. 6 is a circuit diagram of a concrete example of a pulse counter 111 according to the present invention.
Figure 7:
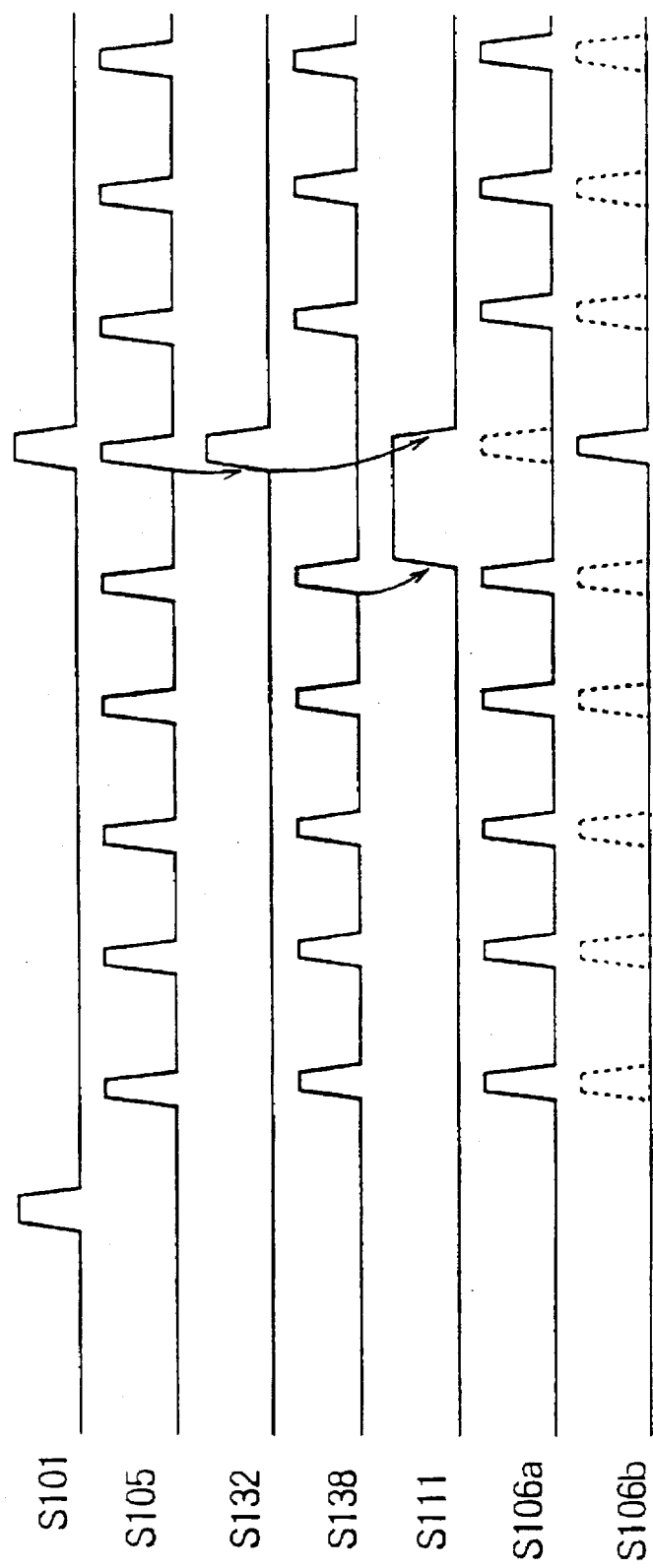
FIG. 7 is a timing chart of input and output waveforms of principal parts in FIG. 4 and FIG. 6.

As shown in FIG. 6, the pulse counter 111 is configured as counters 116 to 121 connected in series, an exclusive OR gate 122 taking a logical sum without carry between an output of the counter 116 and an output in0 of the arithmetic unit 110, an exclusive OR gate 123 taking a logical sum without carry between an output of the counter 117 and an output in1 of the arithmetic unit 110, an exclusive OR gate 124 taking a logical sum without carry between an output of the counter 118 and an output in2 of the arithmetic unit 110, an exclusive OR gate 125 taking a logical sum without carry between an output of the counter 119 and an output in3 of the arithmetic unit 110, an exclusive OR gate 126 taking a logical sum without carry between an output of the counter 120 and an output ink of the arithmetic unit 110, an exclusive OR gate 127 taking a logical sum without carry between an output of the counter 121 and an output in5 of the arithmetic unit 110. A six-input NOR gate 128 performs a NOT-OR operation between outputs of the six exclusive OR gates 122 to 127 and a two-input OR gate 129 takes a logical sum between an output of the NOR gate 128 and the reset signal RST and inputs the result of the logical sum to set terminals (set) of the counters 116 to 121. A flip-flop 130 receives as input an output signal of the six-input NOR gate 128 at a set input terminal S and a two-input AND gate 131 takes a logical product between the delay pulse signal S105 and the signal S111 from an output terminal Q of the flip-flop 130. A counter 132 receives an output signal of the AND gate 131 at an input terminal ck and outputs a pulse signal S132. A two-input OR gate 134 takes a logical sum between an output signal S132 of the counter 132 through a buffer 133 and the reset signal RST and inputs the result of the logical sum to a set terminal (set). An inverter 135 inverts a level of the signal S111 from the output terminal Q of the flip-flop 130 and a flip-flop 136 receives as input the differentiated signal S101 at a set input terminal S. A two-input AND gate 137 takes a logical product between an output signal of the inverter 135 and the signal S107 from the output terminal Q of the flip-flop 130 and inputs the result of the logical product to a reset input terminal R. A three-input AND gate 138 takes a logical product between a signal from an output terminal Q of the flip-flop 136, the output signal of the inverter 135, and the delay pulse signal S105 and inputs the result of the logical product to the input terminal ck of the counters 116.

Figure 8A:
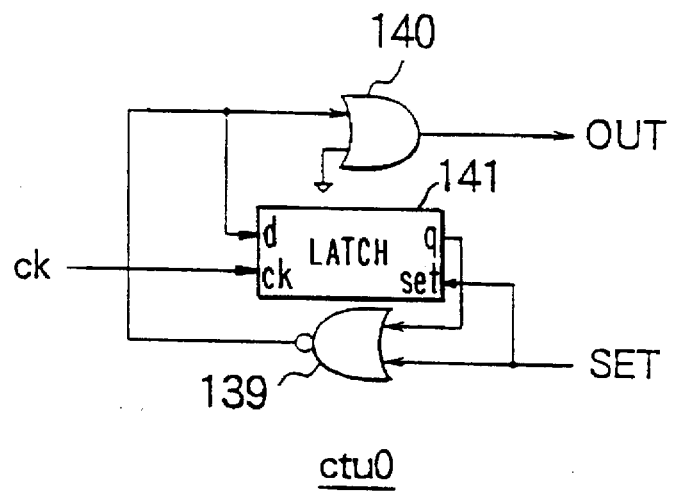
FIG. 8A is a circuit diagram of a concrete example of a counter in FIG. 6.

Note that, as shown in FIG. 8A, the counters 116 and 132 shown in FIG. 6 are comprised of a two-input NOR gate 139, a two-input OR gate 140 and a latch 141.

One input terminal of the NOR gate 139 is connected to a set terminal "set" of the latch 141, the other terminal is connected to an output terminal q, and an output of the NOR gate 139 is connected to one input terminal of the OR gate 140 and an input terminal d of the latch 141. The input terminal ck of the counter 116 or 119 is connected to an input terminal ck of the latch 141, and the input terminal "set" is connected to the set terminal "set", of the latch 141.

In this configuration, the latch 141 is set at a high level [H] by receiving as input a high level signal at the set terminal "set". An output terminal "out" is set to a low level.

Figure 8B:
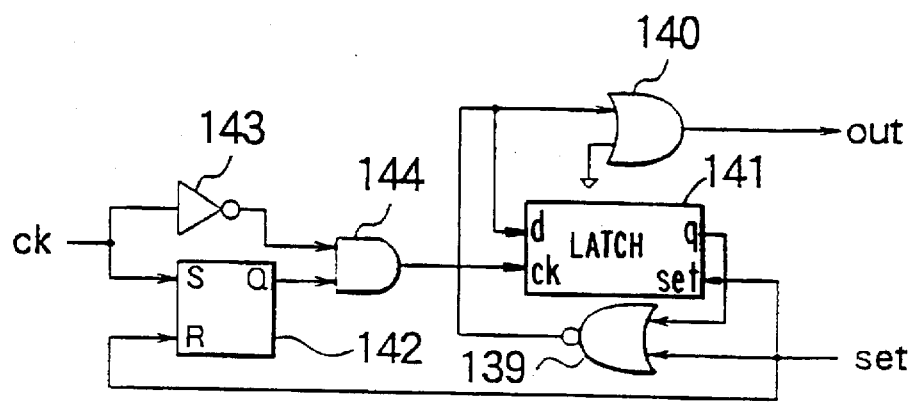
FIG. 8B is a circuit diagram of another concrete example of a counter in FIG. 6.

Also, as shown in FIG. 8B, the counters 117 to 121 shown in FIG. 6 include in addition to the constitution in FIG. 8A, a flip-flop 142 in which a set input terminal S is connected to the input terminal ck and a reset input terminal R connected to the set terminal "set" of the latch 141 and an inverter 143 receiving the input terminal ck. A two-input AND gate 144 takes a logical product between an output signal from an output terminal Q of the flip-flop 142 and an output signal of the inverter 143 and inputs the result of the logical product to the input terminal ck of the latch 141.

In this case too, the latch 141 is set a high level [H] by receiving as input a high level signal at the set terminal "use" An output terminal "out" is set to a low level.

An explanation will be made next of the operation of the multiplier 11 of the above-described structure with reference to the drawings.

The external clock signal CK supplied from outside is supplied to the multipliers 11-1 to 11-n of the clock generator 1.

Also, binary numbers for indicating the multiplying factors are supplied to the pulse selector 106 and the divider 109 in order to divide previously the multiplying factors of the multipliers 11-1 to 11-n.

The external clock signal CK input to the multipliers 11-1 to 11-n is differentiated by the differentiating circuit comprised of the AND gate 101 and the inverter 102. The differentiated signal is input to the flip-flop 104 and the delay controller 105 through the OR gate 103 and input to the phase comparator 107 and the frequency counter 108. The flip-flop 104 receives the pulse signal S104 output from the OR gate 103. As a result, the high level signal S104 is output from the flip-flop 104.

In the frequency counter 108, the frequency is counted, and the count value N1 is output to the divider 109. In the divider 109, a delay value N1 is obtained based on a predetermined expression, and the delay value N1 is output to the delay controller 105.

In the delay controller 105, the pulse signal S103 which is output from the OR gate 103 is delayed according to the delay value N1, and the delayed pulse signal is out put to the pulse selector 106 as the delay pulse signal S105.

In the pulse selector 106, as shown in FIG. 4, a parameter N2 is obtained according to a given binary number in the arithmetic unit 110 and supplied to the pulse counter 111. In the pulse counter 111, a counting operation is started by receipt of the differentiated signal S101. For example, as shown in FIG. 3 and FIG. 7, the signal S111 is output at a low level until five (2n−1)'s are counted. As a result, a second pulse signal S106a synchronized with the delay pulse signal S105 is generated successively at the AND gate 115, and the signal S106a is output to the OR gate 103 and from the AND gate 115.

As a result, as shown in FIG. 3, a clock signal multiplied by n (in FIG. 3, multiplied by 3) is generated and output from the flip-flop 104 shown in FIG. 2 to the clock selector 2 through the synchronous circuit 13. Along with this, in the delay controller 105, the delay pulse signal S105 delayed from the pulse signal S103, which is output sequentially according to the delay value N1 from the OR gate 103, is output to the pulse selector 106.

In the pulse counter 111, five output pulse signals S105 of the delay controller 105 are input, and then the level of the signal S111 is switched from a low level to a high level and the high level signal S111 is output. As a result, when a second external clock signal CK is input, phase adjustment between the differentiated signal S101 and the pulse signal S106b from the Pulse selector 106 is performed and a clock signal S104 adjusted in phase is generated.

Note that, after the pulse counter 111 outputs the signal S111 of a high level, it returns to its initial status. The pulse counter 111 performs the same count operation as described above when receiving the next differentiated signal S101.

In the configuration of FIG. 6, when the two inputs of all of the exclusive OR gates 122 to 127 become the same in level and all of these outputs become low in level, the output of the six-input OR gate 128 becomes a high level, the flip-flop 130 becomes set, and the signal S111 is switched from a low level to a high level. After a predetermined time, the flip-flop 130 is reset.

As explained above, it is possible to change the multiplying factors of the multipliers 11-1 to 11-n freely according to binary numbers given from the outside. Accordingly, it is possible to change the multiplying factors easily without changing the configuration of a circuit after shipment.

Note that, operations the same as described above are performed in the multipliers 11-1 to 11-n, and a plurality of clock signals having required frequencies are output to the clock selector 2 through the synchronous circuit 13.

Also, a (x2) clock signal generated by the multiplier 11-2 multiplying by 2 is given to the frequency dividers 12-1 to 12-m as a reference clock signal.

Next, an explanation will be made of an example of the construction and operation of a frequency divider 12 in the clock generator 1 with reference to FIG. 9 and FIG. 10.

Figure 9:
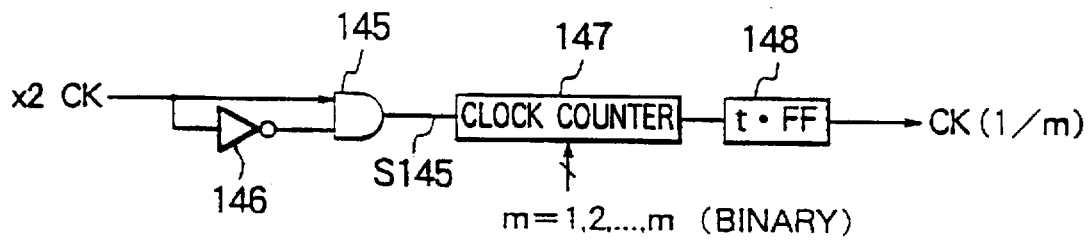
FIG. 9 is a block diagram of an example of the construction of a frequency divider according to the present invention.

As shown in FIG. 9, the frequency divider 12 is configured as a two-input AND gate 145 and inverter 146 constructing a differentiating circuit which differentiates the external clock signal 2CK obtained by multiplying the input external clock signal CK by 2 at the multiplier 11-2 and synchronized with the external clock signal CK. A clock counter 147 counts up the differentiated signals output from the AND gate 145 from binary numbers m (=1, 2, ..., m) indicated from the outside by hardware or software and outputs a signal S147. A T-type flip-flop 148 receives the output signal S147 of the clock counter 147 and outputs a clock signal CK (1/m) divided by m.

Figure 10:
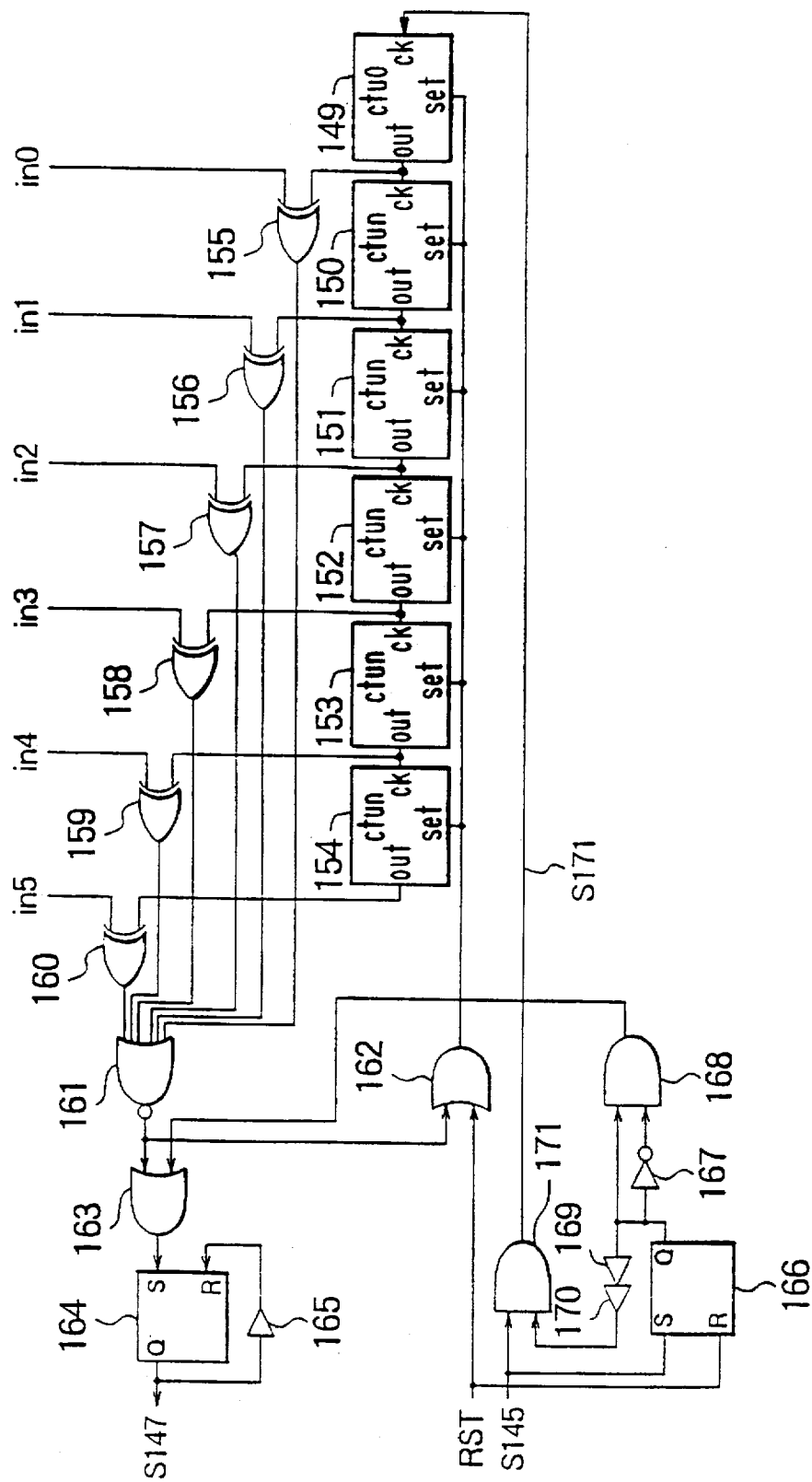
FIG. 10 is a circuit diagram of an example of the construction of a clock counter in FIG. 9.

FIG. 10 is a circuit diagram of an example of the construction of the clock counter 147 in FIG. 9. As shown in FIG. 10, the clock counter 147 is configured as counters 149 to 154 connected in series, with an exclusive OR gate 155 taking a logical sum without carry between an output of the counter 149 and a binary number input in0, an exclusive OR gate 156 taking a logical sum without carry between an output of the counter 150 and a binary number input in1, an exclusive OR gate 157 taking a logical sum without carry between an output of the counter 151 and a binary number input in2, an exclusive OR gate 158 taking a logical sum without carry between an output of the counter 152 and a binary number input in3, an exclusive OR gate 159 taking a logical sum without carry between an output of the counter 153 and a binary number input in4, and an exclusive OR gate 160 taking a logical sum without carry between an output of the counter 154 and a binary number input in5. A six-input NOR gate 161 performs a NOT-OR operation between outputs of the six exclusive OR gates 155 to 160, and a two-input OR gate 162 takes a logical sum between an output of the NOR gate 161 and the reset signal RST and inputs the result of the logical sum to the set terminals (set) of the counters 149 to 154. A two-input OR gate 163 receives as input an output signal of the six-output OR gate 161 at one input terminal. A flip-flop 164 receives an output signal of the two-input OR gate 163 at a set input terminal S and outputs a signal S147 from an output terminal Q connected to the reset input terminal R through a buffer 165. A flip-flop 166 receives the differentiated signal S145 at a set input terminal S and receives the reset signal RST at a reset input terminal R. An inverter 167 inverts a level of an output signal from an output terminal Q of the flip-flop 166. A two-input AND gate 168 takes a logical product between an output signal from an output terminal Q of the flip-flop 166 and an output of the inverter 167 and outputs the result of the logical product. A two-input AND gate 171 takes a logical product between the output signal from the output terminal of the flip-flop 166 through the buffers 169, 170 and the differentiated signal S145 and inputs the result of the logical product to the input terminal ck of the counter 149 as a signal S171.

Note that, the counter 149 shown in FIG. 10 has same construction as shown in FIG. 8A, and the counters 150 to 154 have the same construction as shown in FIG. 8B.

An explanation will be made next of the operation of the frequency divider 12 of the above-described structure with reference to the drawings.

The clock signal 2CK is obtained by multiplying the input external clock signal CK by 2 at the multiplier 11-2 and is synchronized with the external clock signal CK. The clock signal multiplied by 2 is differentiated by a differentiating circuit comprised of the two-input AND gate 145 and the inverter 146, and the differentiated signal S145 is input to the clock counter 147.

In the clock counter 147, at the time of receiving the differentiated signal S145 and after the pulse signal S147 is output to the flip-flop 148, the clock counter 147 counts the binary numbers m(=1, 2, m) indicated from the outside by hardware or software and outputs a signal S147.

Due to this, the clock signal CK (1/m) divided by m is output from the flip-flop 148.

In the configuration of FIG. 10, when the two inputs of all of the exclusive OR gates 155 to 160 become the same in level and all of the outputs become low in level, an output of the six-input OR gate 161 becomes a high level and the flip-flop 164 becomes set, so the signal S147 is switched from a low level to a high level. After a predetermined time, the flip-flop 164 is reset.

As explained above, it is possible to change the dividing factors of the frequency dividers 12-1 to 12-m freely according to a binary number given from the outside. Accordingly, it is possible to change the dividing factors easily without changing the configuration of a circuit after shipment.

Note that, operations the same as described above are performed in each of the frequency dividers 12-1 to 12-m, whereby a plurality of clock signals having required frequencies are output to the clock selector 2 through the synchronous circuit 13.

Next, an explanation will be made below of an example of the construction and operation of the clock selector 2 with reference to FIG. 11.

Figure 11:
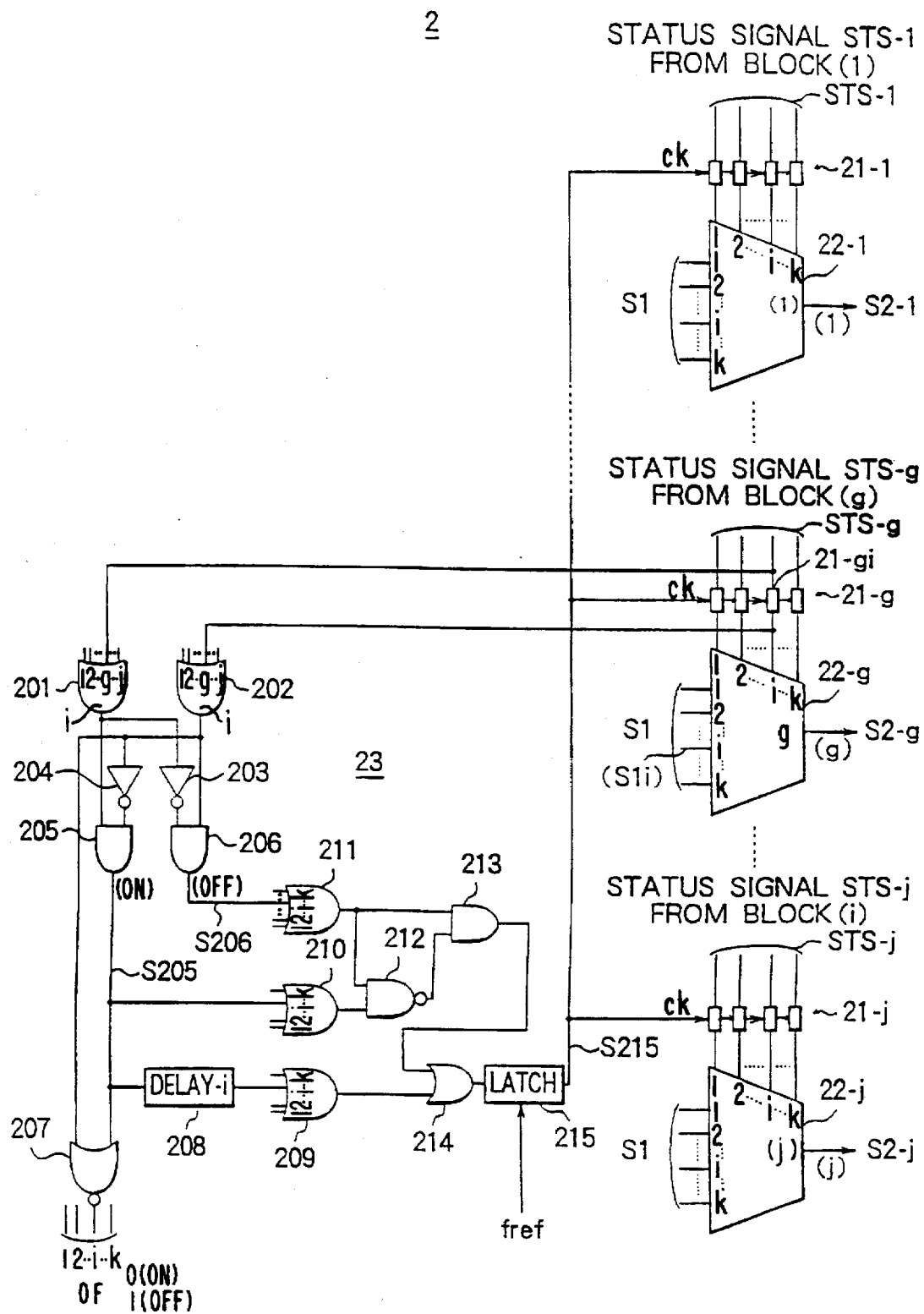
FIG. 11 is a circuit diagram of an example of the construction of a clock selector according to the present invention.

As shown in FIG. 11, a clock selector 2 is configured by j number of latch groups 21-1 to 21-j latching k bits of status signals STS-1, ..., STS-g, and STS-j output from j number of functional blocks, not shown in FIG. 11, of the system. Selectors 22-1 to 22-j select a clock signal having a required frequency from k number of clock signals S1, in which the frequency is set to any frequency generated by the multipliers 11-1 to 11-n and the frequency dividers 12-1 to 12-m of the clock generator I and output from the multipliers and the frequency dividers, according to the status information of block latched in the latch groups 21-1 to 21-j.

The clock selector 2 is further provided with a clock generating and selecting circuit 23 adjusting the selection timings of clock signals S1 of the selectors 22-1 to 22-j according to input information of the status signals ST1-1, ..., STS-g, STS-j in the latch groups 21-1 to 21-j. The clock selector 2 generates an operation control signal OF which holds, among the multipliers 11-1 to 11-n and the frequency dividers 12-1 to 12-m of the clock generator 1, only multipliers and frequency dividers generating clock signals of the required usage frequency at predetermined functional blocks in operational states (ON states) and holds multipliers and frequency dividers generating clock signals of the unused frequencies in a non-operational states (OFF states).

Note that, in FIG. 11, only a clock generating and selecting circuit 23 which is provided corresponding to the status signal supply lines connected to the i-th (i<k) latch among the k number of latches of the latch group 21-g is shown for simplifying the drawing.

As shown in FIG. 11, the clock generating and selecting circuit 23 is configured as a j-input OR gate 201 to which are connected the status signal supply lines of the input side of the i-th latches among the latch groups 22-1 to 22-J, namely, the current status information supply lines. A j-input OR gate 202 is connected to the status signal supply lines of the output side of the i-th latches among the latch groups 22-1 to 22-j, namely, the pre-status information supply lines. An inverter 203 inverts a level of an output signal of the OR gate 201 and an inverter 204 inverts a level of an output signal of the OR gate 202. A two-input AND gate 205 takes a logical product between an output signal of the OR gate 201 and an output signal of the inverter 204 and generates a signal S205 for controlling the ON-OFF state of the multiplier and the frequency divider and output of clock signals of the used frequency from the selectors 22-1 to 22-J. A two-input AND gate 206 takes a logical product between an output signal of the OR gate 202 and an output signal of the inverter 203 and generates a signal S206 for stopping the output of the unused clock signals from the selectors 22-1 to 22-j. A two-input NOR gate 207 performs a NOT-OR operation between an output signal S205 of the AND gate 205 and the output signal of the OR gate 202, generates the operation control signal OF, and outputs the signal OF to the clock generator 1. A delay circuit 208 delays the output signal S205 of the AND gate 205 for a predetermined time, specifically delaying the signal S205 for a time until the multiplier or the frequency divider in an unused state switches to the operational state and then outputs a clock signal in which the frequency is stable. A k-input OR gate 209 takes a logical sum of Outputs of the delay circuits 208 and a k-input OR gate 210 takes a logical sum of the output signals S205 of the AND gate 205. A k-input OR gate 211 takes a logical sum of the output signals S206 of the AND gates 206, a two-input NAND gate 212 performs a NOT-AND operation between outputs of the OR gates 210 and 211, a two-input AND gate 213 takes a logical product between an output signal of the OR gate 211 and an output signal of the NAND gate 212 and a two-input OR gate 214 takes a logical sum between an output signal of the OR gate 209 and an output signal of the OR gate 213, and a latch 215 latches an output signal of the OR gate 209 and an output signal of the AND gate 213, a latch 215 latching an output signal of the OR gate 214 and latching the status signal of the latch groups 21-1 to 21-j at a predetermined timing, and outputs a signal S215 for controlling an output timing.

Note that, the clock generating selecting circuit 23 is provided with an inhibit circuit, which is comprised of the OR gates 210, 211, the NAND gate 212, and the OR gate 213. When the signal S205, which is generated by the AND gate 205 and controls the ON-OFF states of the multiplier and the frequency divider, and the signal S206, which is generated by the AND gate 206 taking a logical product between the output signal of the OR gate 202 and the output signal of the inverter 203 and stops the output of unused clock signals from the selectors 22-1 to 22-j, switch from a low level to a high level at the same time and, for example, a clock signal having the frequency is used by another functional block, a stable operation is achieved.

Next, an explanation will be made below of the operation of the clock selector 2 of the above-described structure.

For example, a g-th functional block is switched from a non-operational state (OFF state) to an operational state (ON state), -and a current status signal STS-g indicating the need for an i-th generated signal S1i obtained by multiplying by n or dividing by m the input external clock signal CK by the multiplier 11 or the frequency divider 12 of the clock generator 1 is supplied to the input of the latch group 21-g and input to the OR gate 201 of the clock generating and selecting circuit 23.

At this time, since the g-th functional block is held in a non-operational state (OFF state) and is not used, pre-status information latched in the latch 21-gi is held at a low level, and an output signal of the latch 21-gi is input to the OR gate 202.

Accordingly, an output signal of the OR gate 201 switches from a low level to a high level, and an output signal of the OR gate 202 is held at a low level. As a result, an output signal S205 of the AND gate 205 switches from the low level to the high level, and an output signal S206 of the OR gate 206 is held at a low level.

As the output signal S205 of the AND gate 205 switches to the high level, the operation control signal OF of an output of the OR gate 207 switches from the high level to the low level and is output to a predetermined multiplier 11 or frequency divider 12 of the clock generator 1. The multiplier 11 or the frequency divider 12 receiving a low level operation control signal OF becomes operational in state, whereby clock signals having predetermined frequencies are generated according to the external clock signal CK in the multiplier 11 or the frequency divider 12. The generated clock signals are input to the selectors 22-1 to 22-j through the synchronous circuit 13.

In parallel with this, the output signal S205 of the AND gate 205 is delayed for a time in which a clock signal having a stable frequency will be generated and then is output to the OR gate 209. Accordingly, an output of the OR gate 214 switches from a low level to a high level and is output to the latch 215. The signal S215 is output to the latch groups 21-1 to 21-j from the latch 215 at a predetermined timing.

As a result, current information at a high level is latched by the latch 21-gi of the latch group 21-g, whereby an i-th clock signal in which the frequency has already stabilized is selected and supplied to the functional block stably.

At this time, as the output of latch 21-gi switched to the high level, an output of the OR gate 202 switches from a low level to a high level, and the output of the AND gate 205 switches from the high level to the low level. However, since the output of the OR gate 202 is a high level, the operation control signal OF is held at a low level, and the multiplier 11 and the frequency divider 12 are held in an operational state stably.

After that, the output of the i-th signal to the g-th functional block is continued until the status information of the latch 21-gi switches from the high level to the low level.

Next, in the case of stopping the output of the i-th signal to the i-th functional block, the current status signal STS-g which indicates that the i-th generated clock signal S1i obtained by multiplying by n or dividing by m the external clock signal is supplied to the input side of the latch 21-g at a low level and input to the OR gate 201 of the clock generating and selecting circuit 23.

At this time, since the g-th functional block is held in an operational state (ON state) and used, the pre-status information latched in the latch 21-gi is held at a high level, and the output of the OR gate 202 is input to the OR gate 202.

Accordingly, the output signal of the OR gate 201 switches from the high level to the low level, and the output signal of the OR gate 202 switches from the low level to the high level. As a result, the output of the AND gate 205 is held at the low level, and the output signal S206 of the AND gate 206 switches from the low level to the high level.

As the output signal S206 of the AND gate 206 is switched to the high level, the output of the OR gate 211 is at a high level and the output of the OR gate 210 is at a low level. Due to this, the output signal of the NAND gate 212 switches from the low level to the high level and, as a result, the output signal of the AND gate 213 switches from the low level to the high level.

Accordingly, the output of the OR gate 214 switches from the low level to the high level and is output to the latch 215. The signal S215 is output to the latch groups 21-1 to 21-j from the latch 215 at a predetermined timing.

As a result, current information at a high level is latched by the latch 21-gi of the latch group 21-g, the selection of the i-th clock signal in which the frequency has already stabilized is stopped, and the supply to the functional block is stopped.

As the output of the latch 21-gi of the latch group 21-g is switched to the low level, the operation control signal OF switches from the low level to the high level and is output to the predetermined multiplier 11 and the predetermined frequency divider 12 of the clock generator 1. The multiplier 11 and the frequency divider 12 receiving the high level operation control signal OF become non-operational in state, and the generation of the clock signal having a required frequency according to the external clock signal CK is stopped.

In this way, at the time of switching the operational state to the non-operational state, the output of the clock signal is stopped without delaying the clock signal by a predetermined time. The switching to the non-operational state will be performed after the supply of the clock signal to the functional block is stopped.

Also, in the case of stopping the output of the i-th signal to the g-th functional block and supplying the i-th signal to another functional block, signal lines of the other delay circuit 208 are held in active states, and the inhibit circuit comprised of the OR gates 210 and 211, the NAND gate 212, and the AND gate 213 operates. As a result, the stopping of the output of the clock signals from the selectors 22-1 to 22-j is inhibited.

The same operation as explained above is performed when switching a plurality of the functional blocks at the same time.

As explained above, according to the present embodiment, n number of multipliers 11-1 to 11-n have variable multiple factors and multiplying a single input external reference clock signal by means of the multiplying factors (xi) to (xn). The m number of frequency dividers have variable dividing factors for dividing a clock signal, which is generated by the multiplier 11-2 multiplying by the multiplying factor (x 2) and synchronized with the external clock signal CK, by means of the dividing factors (x 1/1) to (x 1/m). A clock generator 1 is comprised of a synchronous circuit 13 making k (n+m) number of clock signals, which are generated by the multipliers 11-1 to 11-n and the frequency dividers 12-1 to 12-n having different frequencies, synchronized with the reference clock signal CK. A clock selector 2 receives a plurality of clock signals generated by the clock generator 1 and status signals STS sent from each of the functional blocks of a system, not shown, and applies different signals by switching the frequency according to the operational status of each of functional blocks selectively The clock selector 2 also generates an operation control signal for making the multipliers 11-1 to 11-n and the frequency dividers 12-1 to 12-m in the clock generator 1, which generate unused frequencies, stop and outputs the signal OF to the clock generator 1. It is therefore possible to supply a plurality of clock signals having required frequencies and prevent needless power consumption of each clock by switching the frequency supplied to the block according to the status of operation of each block in the system.

Since it is possible to make the multipliers and the frequency dividers generating frequencies which are not being used stop and to thereby prevent needless power consumption, it is possible to lower the power consumption of the system or chip as a whole.

Many widely different embodiments of the present invention may be constructed without departing from the scope of the invention. It is understood that the present invention is not restricted to the specific embodiments described above.

What is claimed is:

1. A clock signal generator, comprising:
   a clock generator having at least a first multiplier, which has a first variable multiplying factor, for multiplying an input reference clock signal by the first variable multiplying factor to generate a first clock signal of a first frequency and a second multiplier, which has a second variable multiplying factor, for multiplying the input reference clock signal by the second variable multiplying factor to generate a second clock signal of a second frequency;

a clock selector for receiving a status signal specifying a desired clock frequency for a functional block, for supplying the functional block with the first clock signal when the desired frequency equals the first frequency, and for supplying the functional block with the second clock signal when the desired frequency equals the second frequency, and for supplying the clock generator with an operation control signal, said operation control signal for stopping the first multiplier when the desired frequency is the second frequency and for stopping the second multiplier when the desired frequency is the first frequency.

2. A clock signal generator, comprising:

a clock generator having at least one multiplier, which has a variable multiplying factor, for multiplying an input reference clock signal by a designated multiplying factor and at least one frequency divider, which has a variable dividing factor, for dividing the input reference clock signal by a designated dividing factor;

a clock selector for selecting a desired clock signal having a desired frequency from outputs of the at least one multiplier and the at least one divider and for supplying the desired clock signal to a functional block, the clock selector receiving a status signal from the functional block which specifies the desired frequency;

wherein said multiplier comprises:

a first pulse signal generator receiving the input reference clock signal and generating a first pulse signal which has a predetermined pulse width according to the input reference clock signal;

a decision circuit specifying a delay value according to a first natural number, the first natural number determining the designated multiplying factor;

a delay circuit delaying the first pulse signal according to the delay value to form a delayed pulse signal;

an output circuit switching an output level between a first level and a second level at each input of the first pulse signal or a second pulse signal;

a second pulse signal generator receiving the delayed pulse signal from the delay circuit and generating the second pulse signal and a third pulse signal which have a complementary relationship with each other, the second pulse signal generator generating the second and third pulse signals using the first natural number designating the multiplying factor and supplying the second pulse signal to the delay circuit and the output circuit; and a pulse phase adjusting circuit comparing the first pulse signal generated by the first pulse signal generator with the third pulse signal and feeding back a result of the comparison to the delay circuit to adjust a phase of the delayed pulse signal.

3. A clock signal generator according to claim 1, wherein said second multiplier comprises a frequency divider, the second variable multiplying factor comprises a variable dividing factor, and said frequency divider includes:

a pulse signal generator generating a pulse signal which has a predetermined pulse width based on the input reference clock signal;

a delay circuit receiving the pulse signal generated by the pulse signal generator and delaying the pulse signal by a natural number designating the variable dividing factor; and an output circuit receiving the delayed pulse signal from the delay circuit and outputting the second clock signal which has a pulse width proportional to a delay value of the delay circuit.

4. The clock signal generator as set forth in claim 1, wherein the clock generator comprises a plurality of multipliers, including the first and second multipliers, for multiplying the input reference clock signal by a respective plurality of variable multiplying factors and a plurality of dividers for dividing the input reference clock signal by a respective plurality of variable dividing factors.

5. A clock signal generator according to claim 4, wherein said clock selector comprises:

a plurality of latch groups each latching a plurality of status signals output from a plurality of functional blocks, each of the status signals designating a desired clock signal for the respective functional block;

a plurality of selectors each selecting the desired clock signal which has a desired frequency from among clock signals output from the multipliers and the frequency dividers of the clock generator; and the clock selector for adjusting the clock signals selected by each of the plurality of selectors according to the status signals latched by the latch groups and for generating operation control signals for the multipliers and frequency dividers, the operation control signals enabling only the multipliers and the frequency dividers generating clock signals designated by the status signals and stopping multipliers and the frequency dividers that generate clock signals not used by any of the functional blocks.

6. A clock signal generator according to claim 1, further comprising an inhibit circuit for inhibiting the stopping of the first multiplier when a second functional block generates a second status signal specifying the first frequency as the desired frequency for the second functional block and for inhibiting the stopping of the second multiplier when the second status signal specifies the second frequency as the desired frequency for the second functional block.

7. The clock signal generator as set forth in claim 1, wherein the second multiplier multiplies the input reference clock signal by the second variable multiplying factor which has a value less than 1.

8. The clock signal generator as set forth in claim 1, wherein the clock selector receives a plurality of status signals specifying desired clock frequencies for a plurality of functional blocks and for supplying the functional blocks with the first clock signal when their respective status signals designate the first frequency as the desired frequency and for supplying the functional blocks with the second clock signal when their respective status signals designate the second frequency as the desired frequency.

9. The clock signal generator as set forth in claim 1, wherein the first multiplier receives the input reference clock signal and multiplies the input reference clock signal by the first variable multiplying factor and the second multiplier receives an output from the first multiplier and multiplies the output from the first multiplier by a third variable multiplying factor, the third variable multiplying factor being equal to a quotient of the second variable multiplying factor by the first variable multiplying factor.

10. A clock signal generator, comprising:

a clock generator having a plurality of multipliers, each having a variable multiplying factor, for multiplying an input reference clock signal by designated multiplying factors and a plurality of frequency dividers, each having a variable dividing factor, for dividing the input reference clock signal by designated dividing factors;

a clock selector for selecting desired clock signals having desired frequencies from outputs of the multipliers and dividers and for supplying the desired clock signals to a plurality of functional blocks, the clock selector receiving status signals from the functional blocks which specify the desired frequencies;

wherein the clock selector includes a clock selecting circuit for receiving the status signals and for generating operation control signals, said operation control signals supplied to the plurality of multipliers and the plurality of dividers and are for enabling the multipliers and dividers which generate any one of the desired clock signals and for stopping the multipliers and dividers that do not generate any one of the desired clock signals.

11. The clock signal generator as set forth in claim 10, wherein the clock selecting circuit comprises a delay circuit for delaying the stopping of each multiplier and divider until a subsequent clock cycle and for preventing each multiplier and divider from being stopped when the status signal received at the subsequent clock cycle from any one of the functional blocks designates the multiplier or the divider.

12. The clock signal generator as set forth in claim 10, wherein the designated multiplying factor is unique for each multiplier and the designated dividing factor is unique for each divider.

13. The clock signal generator as set forth in claim 10, wherein the clock selector comprises a plurality of latch groups with each latch group associated with a respective functional block, each latch group receiving the status signals from the respective functional block and latching the desired clock signal for the respective functional block out of the clock signals from all of the multipliers and dividers.

14. The clock signal generator as set forth in claim 13, wherein the clock selecting circuit comprises a plurality of clock selecting circuits with each clock selecting circuit associated with a respective latch group and functional block, each clock selecting circuit supplying an enable signal to the multiplier or divider generating the desired clock signal for the respective functional block.

15. The clock signal generator as set forth in claim 14, wherein each multiplier or divider is disabled unless the multiplier or divider receives the enable signal from one of the clock selecting circuits.

\* \* \* \* \*